United States Patent
Kondo

(10) Patent No.: US 11,809,082 B2
(45) Date of Patent: Nov. 7, 2023

(54) PATTERN FORMING METHOD AND TEMPLATE MANUFACTURING METHOD

(71) Applicant: Kioxia Corporation, Tokyo (JP)

(72) Inventor: Mitsuru Kondo, Kawasaki (JP)

(73) Assignee: KIOXIA CORPORATION, Tokyo (JP)

( * ) Notice: Subject to any disclaimer, the term of this patent is extended or adjusted under 35 U.S.C. 154(b) by 176 days.

(21) Appl. No.: 17/189,707

(22) Filed: Mar. 2, 2021

(65) Prior Publication Data
US 2021/0302840 A1  Sep. 30, 2021

(30) Foreign Application Priority Data
Mar. 24, 2020  (JP) ................................ 2020-053240

(51) Int. Cl.
G03F 7/20 (2006.01)
G03F 7/039 (2006.01)
G03F 7/32 (2006.01)

(52) U.S. Cl.
CPC ............ *G03F 7/2022* (2013.01); *G03F 7/039* (2013.01); *G03F 7/0392* (2013.01); *G03F 7/2002* (2013.01); *G03F 7/2037* (2013.01); *G03F 7/322* (2013.01); *G03F 7/325* (2013.01)

(58) Field of Classification Search
CPC ...... G03F 7/2022; G03F 7/039; G03F 7/0392; G03F 7/2002; G03F 7/2037; G03F 7/322; G03F 7/325; G03F 7/0752; G03F 7/40; G03F 7/0002; G03F 7/095; G03F 7/203
See application file for complete search history.

(56) References Cited

U.S. PATENT DOCUMENTS

| 5,432,047 A | * | 7/1995 | Cheng | G11B 7/261 |
| 5,750,309 A | * | 5/1998 | Hatakeyama | G03F 7/0045 |
| | | | | 430/905 |
| 8,198,016 B2 | | 6/2012 | Hatakeyama et al. | |
| 8,222,150 B2 | | 7/2012 | Hashimoto | |

(Continued)

FOREIGN PATENT DOCUMENTS

JP 3943741 B2 7/2007
JP 4985987 B2 7/2012

OTHER PUBLICATIONS

Akihiro Oshima, Tomoko Gowa Oyama, Masakazu Washio, Seiichi Tagawa, "Evaluation of sensitivity for positive tone non-chemically and chemically amplified resists using ionized radiation: EUV, x-ray, electron and ion induced reactions," Proc. SPIE 8682, 86821A (Mar. 29, 2013) (Year: 2013).*

*Primary Examiner* — Mark F. Huff
*Assistant Examiner* — Alexander Nicholas Lee
(74) *Attorney, Agent, or Firm* — Foley & Lardner LLP

(57) ABSTRACT

A pattern forming method includes forming a resist film having a first region, a second region, and a third region, on a substrate, irradiating the first region with light or an energy ray in a first irradiation amount, and irradiating the second region with light or an energy ray in a second irradiation amount, the second irradiation amount being smaller than the first irradiation amount. The pattern forming method also includes dissolving the resist film of the first region by using first liquid, forming a coating film on a side surface of the resist film after the resist film of the first region is dissolved, and dissolving the third region by using second liquid that is different from the first liquid.

5 Claims, 4 Drawing Sheets

(56) References Cited

U.S. PATENT DOCUMENTS

| | | |
|---|---|---|
| 8,764,999 B2 | 7/2014 | Dunn et al. |
| 8,791,024 B1 * | 7/2014 | Lu ..................... H01L 21/0274 |
| | | 257/E21.492 |
| 2001/0018166 A1 * | 8/2001 | Fujino .................... G03F 7/325 |
| | | 430/311 |
| 2010/0119960 A1 * | 5/2010 | Fonseca .................. G03F 7/322 |
| | | 430/30 |
| 2010/0136784 A1 * | 6/2010 | Mebarki ........... H01L 21/76837 |
| | | 438/669 |
| 2014/0080069 A1 * | 3/2014 | Yang .................... G03F 7/0035 |
| | | 430/326 |
| 2016/0035628 A1 * | 2/2016 | Tsujita ............ H01L 21/823828 |
| | | 438/703 |

\* cited by examiner

CROSS SECTION A-A'

PATTERN FORMING METHOD AND TEMPLATE MANUFACTURING METHOD

CROSS-REFERENCE TO RELATED APPLICATION(S)

This application is based upon and claims the benefit of priority from Japanese Patent Application No. 2020-053240, filed Mar. 24, 2020, the entire contents of which are incorporated herein by reference.

FIELD

Embodiments described herein relate generally to a pattern forming method and a template manufacturing method.

BACKGROUND

Techniques using a sidewall transferring process to manufacture a template that is used in an imprinting method, are publicly known.

Examples of related art include JP-B-3943741 and U.S. Pat. No. 8,222,150.

DETAILED DESCRIPTION

Figure 1A:
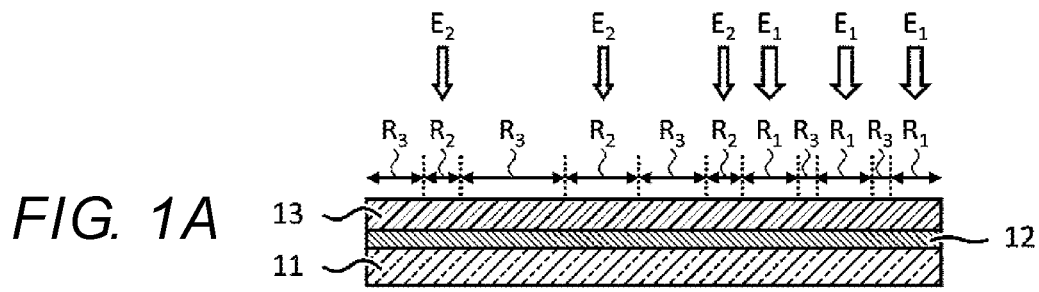
FIGS. 1A to 1E show a pattern forming method according to a first embodiment.

At least one embodiment provides a pattern forming method and a template manufacturing method that enable forming mask patterns with various widths by using a sidewall transferring process.

In general, according to at least one embodiment, a pattern forming method includes forming a resist film having a first region, a second region, and a third region, on a substrate, irradiating the first region with light or an energy ray in a first irradiation amount, and irradiating the second region with light or an energy ray in a second irradiation amount, the second irradiation amount being smaller than the first irradiation amount. The pattern forming method also includes dissolving the resist film of the first region by using a first liquid, forming a coating film on a side surface of the resist film after the resist film of the first region is dissolved, and dissolving the third region by using a second liquid that is different from the first liquid.

Hereinafter, embodiments of the present disclosure will be described with reference to the drawings. In the descriptions in the drawings described below, the same or similar parts are denoted by the same or similar reference signs. It is noted that the drawings are schematic examples, which differ from actual objects in, e.g., relationships between thickness and plane dimensions.

In this specification, the sidewall transferring process is a process of forming a pattern that includes a resist film and a coating film by the method shown in FIGS. 1A to 1E or FIGS. 2A to 2E and transferring this pattern to a hard mask film. The methods shown in FIGS. 1A to 1E and FIGS. 2A to 2E will be described below.

First Embodiment

First, a pattern forming method according to the first embodiment will be described with reference to FIGS. 1A to 1E. FIGS. 1A to 1E show the pattern forming method according to at least one embodiment.

As shown in FIG. 1A, first, a hard mask film 12 is formed on a substrate 11. The substrate 11 is, for example, made primarily of quartz. The hard mask film 12 is, for example, made primarily of chromium.

A resist film 13 is formed on the hard mask film 12. The resist film 13 is formed by, for example, applying a resist material with the use of a spin coating method and baking this resist material. The resist material is, for example, chemically amplified positive resist.

The chemically amplified positive resist has a characteristic that, upon being irradiated with light or an energy ray in a certain amount or greater, the irradiated part becomes soluble in an alkali developer. The chemically amplified positive resist includes those in which a part of a side chain of alkali liquid soluble polymer is substituted with a low polar functioning group, such as t-butoxycarbonyl group, t-butoxycarbonylmethyl group, or acetal group, so as to be insoluble in an alkali developer. These functioning groups are also called "acid-labile protecting groups". The chemically amplified positive resist also includes photoacid generating agents, such as onium salts, nitrobenzyl ester, diazomethane, and triazine. These photoacid generating agents are photodecomposed upon irradiation of light or an energy ray and generate acids. Moreover, the acid-labile protecting group develops deprotection reaction by using acid as catalyst, in response to baking after the irradiation. This changes the polarity of resin and changes the state from a state of being slightly soluble in alkali to a state of being easily soluble in alkali, whereby it is possible to obtain a positive pattern after development using the alkali developer.

The chemically amplified positive resist also has a characteristic that it becomes slightly soluble in an organic solvent upon being irradiated with light or an energy ray in a certain amount or greater.

As shown in FIG. 1A, it is possible to set multiple regions in the formed resist film 13. This embodiment describes a case of setting, for example, regions $R_1$, $R_2$, and $R_3$, as the multiple regions.

Next, the regions $R_1$ are irradiated with light or an energy ray of an irradiation amount $E_1$, and the regions $R_2$ are irradiated with light or an energy ray of an irradiation amount $E_2$. The light or the energy ray that is emitted may be, for example, an ultraviolet ray or an electron ray.

The irradiation amount $E_1$ is set at a degree that makes the resist film 13 soluble in the alkali developer. The irradiation amount $E_2$ is set at a degree that makes the resist film 13 slightly soluble in the alkali developer and in the organic solvent, which will be described later. In view of this, the irradiation amount $E_2$ is smaller than the irradiation amount $E_1$. It is noted that the "irradiation amount" means a dose in the embodiments.

Figure 1B:
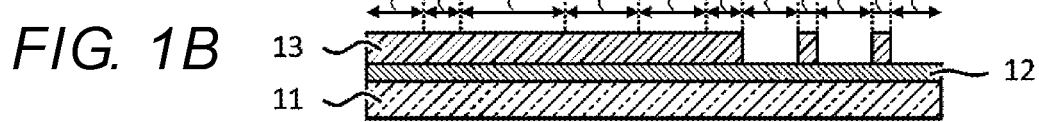

Thereafter, as shown in FIG. 1B, the resist film 13 of the regions $R_1$ is dissolved by using the alkali developer. This removes the resist film 13 of the regions $R_1$ to form spaces S. The alkali developer is, for example, tetramethyl ammonium hydroxide (TMAH) or potassium hydroxide solution. Moreover, it is also possible to use inorganic alkali solutions, such as of sodium hydroxide, sodium silicate, and ammonia, primary amines, such as ethylamine and propylamine, secondary amines, such as diethylamine and dipropylamine, tertiary amines, such as trimethylamine and triethylamine, alcohol amines, such as diethylethanol amine and triethanol amine, and quaternary ammonium hydroxides, such as tetraethylammonium hydroxide, triethylhydroxymethylammonium hydroxide, and trimethylhydroxyethylammonium hydroxide. These alkali developers may be those to which a water-soluble organic solvent, such as methanol or ethanol, a surface active agent, a resin-dissolution inhibitor, or other additives, is added, as necessary. In the case of adding the water-soluble organic solvent, the water-soluble organic solvent is desirably in an amount of 10 mass % or less.

Figure 1C:
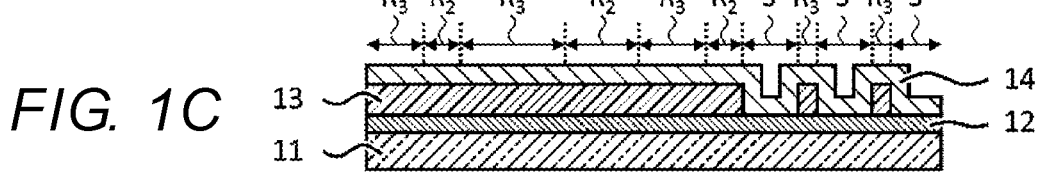

Next, as shown in FIG. 1C, a coating film 14 is formed on upper surfaces and side surfaces of the resist film 13 of the regions $R_2$ and $R_3$. The coating film 14 is formed by, for example, atomic layer deposition (ALD) or molecular layer deposition (MLD). The coating film 14 is, for example, made primarily of silicon oxide.

Figure 1D:
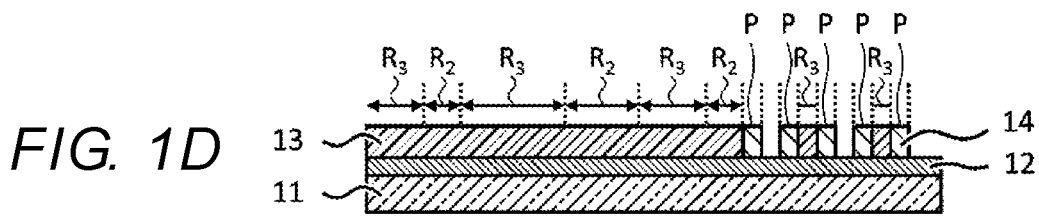

Then, the coating film 14 is etched until the upper surfaces of the resist film 13 of the regions $R_2$ and $R_3$ are exposed. This forms sidewall patterns P, as shown in FIG. 1D.

Figure 1E:
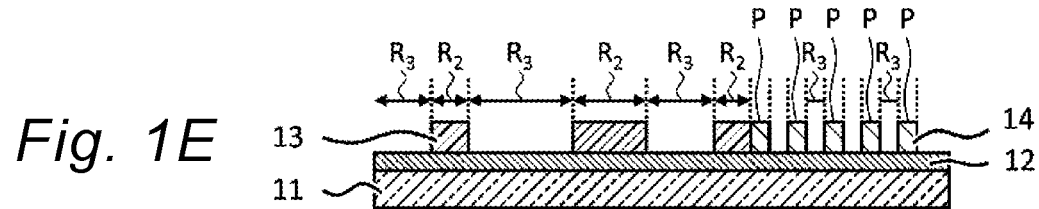

Thereafter, as shown in FIG. 1E, the resist film 13 of the regions $R_3$ is dissolved by using the organic solvent. This forms a mask pattern having the regions $R_2$ of the resist film 13 and the sidewall patterns P. The organic solvent is, for example, ethyl acetate. Moreover, it is also possible to use aliphatic hydrocarbon solvents, such as hexane, cyclohexane, heptane, and octane, aromatic hydrocarbon solvents, such as benzene, toluene, o-xylen, m-xylen, and p-xylen, ketone solvents, such as methyl ethyl ketone, diethyl ketone, methyl isobutyl ketone, methyl isoamyl ketone, 2-heptanone, cyclopentanone, and cyclohexanone, ester solvents, such as n-propyl acetate, isopropyl acetate, n-butyl acetate, isobutyl acetate, s-butyl acetate, t-butyl acetate, n-amyl acetate, isoamyl acetate, n-hexyl acetate, dimethyl malonate, diethyl malonate, di-n-propyl malonate, di-n-butyl malonate, methyl lactate, ethyl lactate, n-propyl lactate, n-butyl lactate, n-amyl lactate, isoamyl lactate, and γ-butyrolactone, alcohol solvents, such as methanol, ethanol, n-propanol, and isopropanol, ether solvents, such as tetrahydrofuran, 1,4-dioxane, diethylene glycol dimethyl ether, and anisole, and amide solvents, such as dimethylformamide, dimethylacetamide, and 1-methyl-2-pyrrolidone.

In the sidewall transferring process, the width of a pattern that is formed by filling a space S with the coating film 14 is normally approximately twice the thickness of the coating film 14, at the maximum. For this reason, in a region that is required to include a pattern having a larger width, it is necessary to again perform, e.g., pattern forming or processing, with the use of resist, after the sidewall transferring process is performed.

On the other hand, the pattern forming method of at least one embodiment enables forming mask patterns having various widths by using the sidewall transferring process. This eliminates the need to perform, e.g., pattern forming or processing, with the use of resist, after the sidewall transferring process is performed. As a result, it is possible to omit many processes and thereby reduce cost. The reduction in process improves yield.

Second Embodiment

Next, a pattern forming method according to the second embodiment will be described with reference to FIGS. 2A to 2E. FIGS. 2A to 2E show the pattern forming method according to at least one embodiment.

The second embodiment differs from the first embodiment mainly in using two different kinds of resist materials for resist films.

Figure 2A:
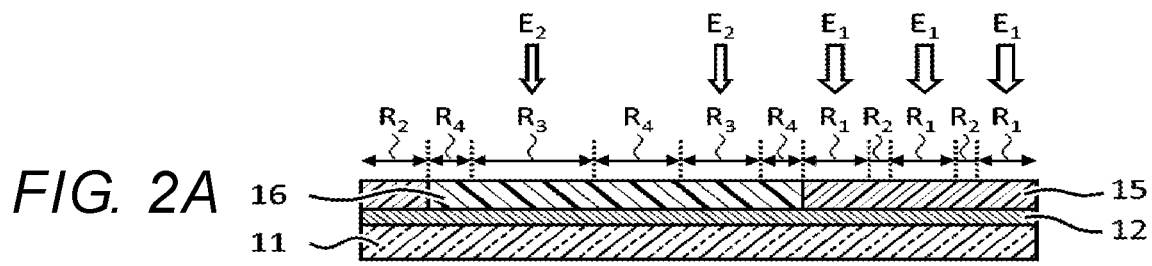
FIGS. 2A to 2E show a pattern forming method according to a second embodiment.

As shown in FIG. 2A, first, a hard mask film 12 is formed on a substrate 11. Resist films 15 and 16 are formed on the same surface of the hard mask film 12. The resist films 15 and 16 are formed such that, for example, after a first resist is applied by a spin coating method and is baked, irradiation of light or an energy ray and development are performed to form a space, and a second resist is then applied to the formed space by an ink jetting method.

The material of the resist film 15 is, for example, chemically amplified positive resist. The material of the resist film 16 is, for example, non-chemically amplified main chain decomposed positive resist. The non-chemically amplified main chain decomposed positive resist has a characteristic that, upon being irradiated with light or an energy ray in a certain amount or greater, the irradiated part becomes soluble in organic solvent. The non-chemically amplified main chain decomposed positive resist is, for example, made primarily of resin of isopropenylketone polymer or acrylic polymer that contains a constitutional unit obtained from methacrylate ester or acrylate ester as a main component. The non-chemically amplified main chain decomposed positive resist increases in solubility in the organic solvent upon irradiation of, for example, an ultraviolet ray having a wavelength of 100 to 400 nm. On the other hand, irrespective of irradiation of light or an energy ray, the non-chemically amplified main chain decomposed positive resist has a characteristic of being slightly soluble in the alkali developer.

As shown in FIG. 2A, it is possible to set multiple regions in the formed resist films 15 and 16. This embodiment describes a case of setting, for example, regions $R_1$ and $R_2$ for the resist film 15 and regions $R_3$ and $R_4$ for the resist film 16, as the multiple regions.

Next, the region $R_1$ is irradiated with light or an energy ray of an irradiation amount $E_1$, and the region $R_3$ is irradiated with light or an energy ray of an irradiation amount $E_2$. The light or the energy ray that is emitted is, for example, an ultraviolet ray or an electron ray.

The irradiation amount $E_1$ is set at a degree that makes the resist film 15 soluble in the alkali developer. The irradiation amount $E_2$ is set at a degree that makes the resist film 16 soluble in the organic solvent. In at least one embodiment, with regard to the magnitude relationship between the irradiation amounts $E_1$ and $E_2$, either $E_1$ or $E_2$ may be greater than the other or both may be the same.

Figure 2B:
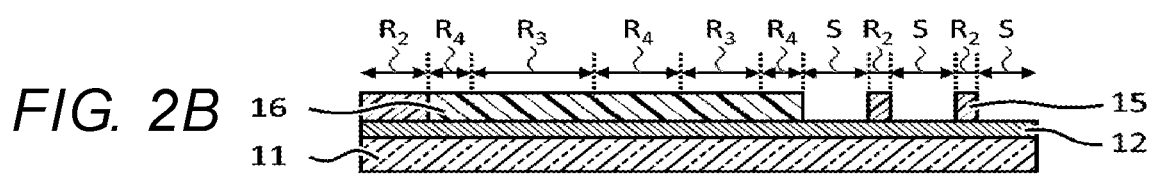

Thereafter, as shown in FIG. 2B, the resist film 15 of the regions $R_1$ is dissolved by using the alkali developer. The alkali developer is, for example, tetramethyl ammonium hydroxide (TMAH) or potassium hydroxide solution. Moreover, it is also possible to use inorganic alkali solutions, such as of sodium hydroxide, sodium silicate, and ammonia, primary amines, such as ethylamine and propylamine, secondary amines, such as diethylamine and dipropylamine, tertiary amines, such as trimethylamine and triethylamine, alcohol amines, such as diethylethanol amine and triethanol amine, and quaternary ammonium hydroxides, such as tetraethylammonium hydroxide, triethylhydroxymethylammonium hydroxide, and trimethylhydroxyethylammonium hydroxide. These alkali developers may be those to which a water-soluble organic solvent, such as methanol or ethanol, a surface active agent, a resin-dissolution inhibitor, or other additives, is added, as necessary.

Figure 2C:
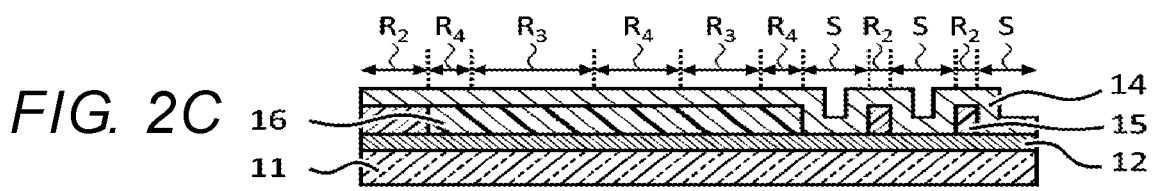

Next, as shown in FIG. 2C, a coating film 14 is formed on upper surfaces and side surfaces of the resist film 15 of the regions $R_2$ and of the resist film 16 of the regions $R_3$ and $R_4$. The coating film 14 is formed by, for example, atomic layer deposition (ALD) or molecular layer deposition (MLD). The coating film 14 is, for example, made primarily of silicon oxide.

Figure 2D:
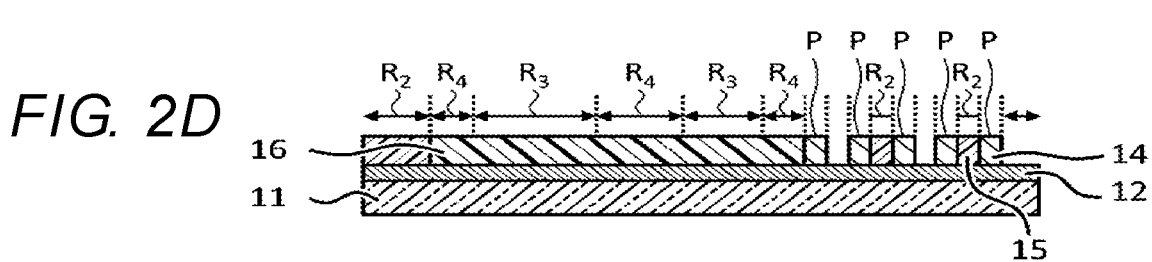

Then, the coating film 14 is etched until the upper surfaces of the resist film 15 of the regions $R_2$ and of the resist film 16 of the regions $R_3$ and $R_4$ are exposed. This forms sidewall patterns P, as shown in FIG. 2D.

Figure 2E:
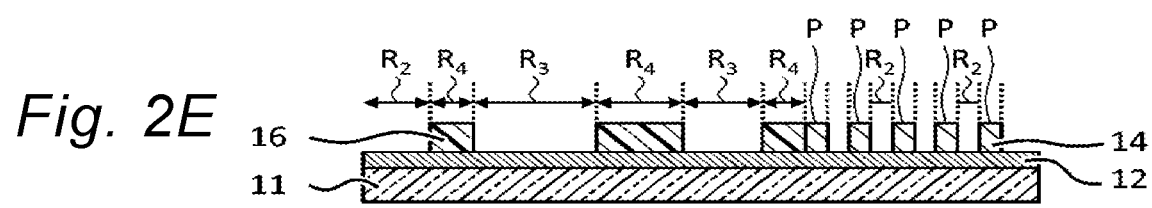

Thereafter, as shown in FIG. 2E, the resist film 15 of the regions $R_2$ and the resist film 16 of the regions $R_3$ are dissolved by using the organic solvent. This forms a mask pattern having the regions $R_4$ of the resist film 16 and the sidewall patterns P. The organic solvent is, for example, ethyl acetate. Moreover, it is also possible to use aliphatic hydrocarbon solvents, such as hexane, cyclohexane, heptane, and octane, aromatic hydrocarbon solvents, such as benzene, toluene, o-xylen, m-xylen, and p-xylen, ketone solvents, such as methyl ethyl ketone, diethyl ketone, methyl isobutyl ketone, methyl isoamyl ketone, 2-heptanone, cyclopentanone, and cyclohexanone, ester solvents, such as n-propyl acetate, isopropyl acetate, n-butyl acetate, isobutyl acetate, s-butyl acetate, t-butyl acetate, n-amyl acetate, iso-amyl acetate, n-hexyl acetate, dimethyl malonate, diethyl malonate, di-n-propyl malonate, di-n-butyl malonate, methyl lactate, ethyl lactate, n-propyl lactate, n-butyl lactate, n-amyl lactate, isoamyl lactate, and γ-butyrolactone, alcohol solvents, such as methanol, ethanol, n-propanol, and isopropanol, ether solvents, such as tetrahydrofuran, 1,4-dioxane, diethylene glycol dimethyl ether, and anisole, and amide solvents, such as dimethylformamide, dimethylacetamide, and 1-methyl-2-pyrrolidone.

As in the first embodiment, the pattern forming method of this embodiment enables forming mask patterns having various widths by using the sidewall transferring process. This eliminates the need to perform, e.g., pattern forming or processing, with the use of resist, after the sidewall transferring process is performed. As a result, it is possible to omit many processes and thereby reduce cost. The reduction in process improves yield.

Third Embodiment

Figure 3A:
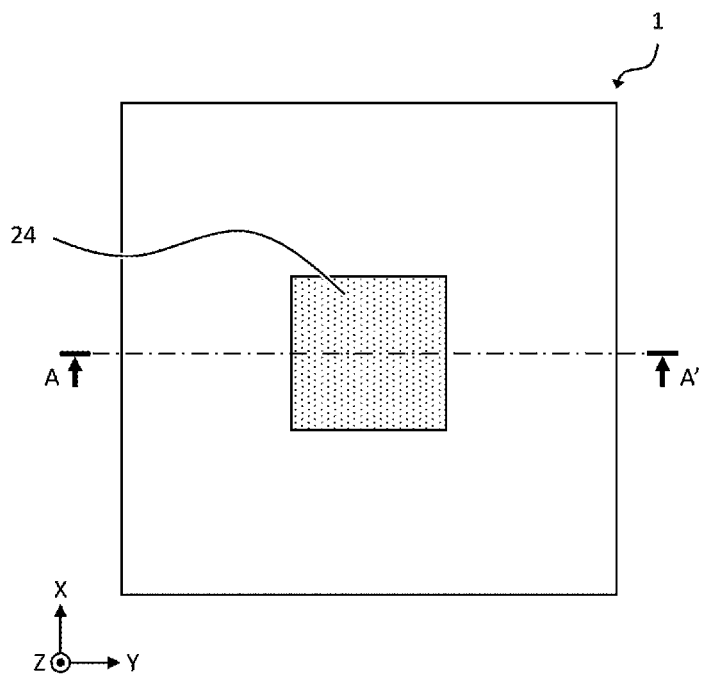
FIGS. 3A and 3B show a structure of a template according to a third embodiment.
Figure 3B:
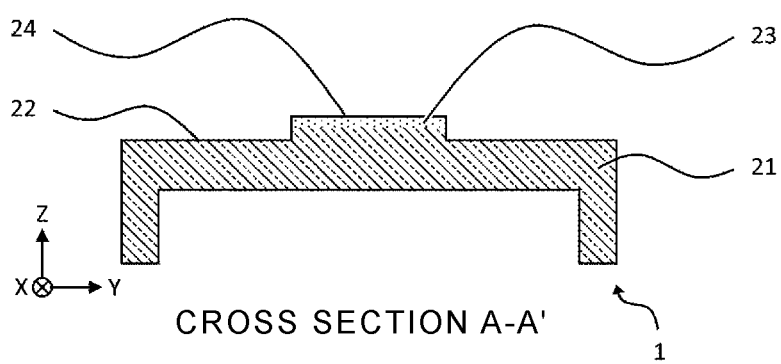

Next, a template manufacturing method according to the third embodiment will be described with reference to FIGS. 3A, 3B, and 4A to 4D. FIGS. 3A and 3B show a structure of a template according to at least one embodiment. FIGS. 4A to 4D show the template manufacturing method according to at least one embodiment.

First, the template according to this embodiment will be described with reference to FIGS. 3A and 3B. FIGS. 3A and 3B show a structure of a template 1 according to at least one embodiment. FIG. 3A is a plane view of the template 1 as viewed from a Z-direction. FIG. 3B is a sectional view of the template 1 along A-A' as viewed from an X-direction. The template 1 is a processed substrate 21 that is quadrilateral as viewed from the Z-direction. In a case of nanoimprint lithography using light, the template 1 is, for example, made primarily of quartz or a transparent material.

A mesa structure 23 is provided at the center of a main surface 22 of the substrate 21 in such a manner as to protrude in an approximately trapezoidal shape from the main surface 22. The mesa structure 23 includes a pattern surface 24. The pattern surface 24 is formed with recesses that constitute a transfer pattern or an alignment mark.

Figure 4A:
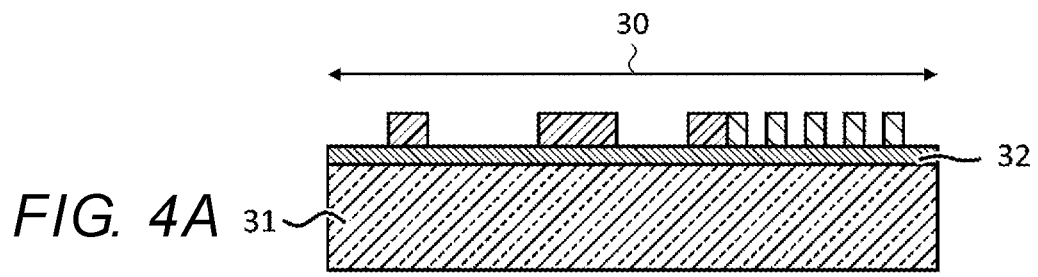
FIGS. 4A to 4D show a template manufacturing method according to the third embodiment.

Next, the template manufacturing method according to at least one embodiment will be described with reference to FIGS. 4A to 4D. As shown in FIG. 4A, a mask pattern 30 is formed by the pattern forming method described in First Embodiment or Second Embodiment.

Figure 4B:
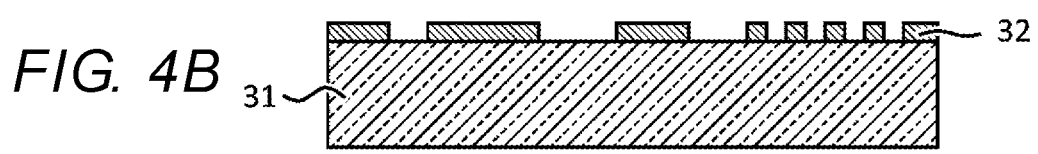

Next, as shown in FIG. 4B, a hard mask film 32 is etched by using the mask pattern 30 as a mask. Thus, the mask pattern 30 is transferred to the hard mask film 32.

Figure 4C:
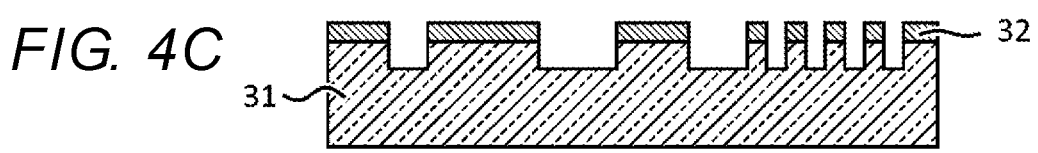

Thereafter, as shown in FIG. 4C, a substrate 31 is etched by using the hard mask film 32 to which the mask pattern 30 is transferred, as a mask.

Figure 4D:
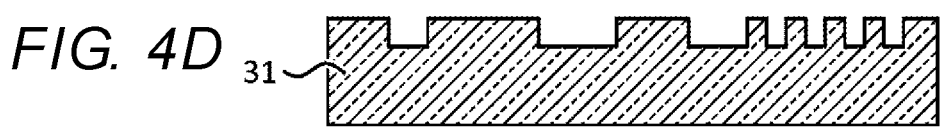

Then, as shown in FIG. 4D, the hard mask film 32 is removed. With this method, it is possible to form templates including patterns having various widths. The hard mask film 32 is removed by, for example, wet etching or dry etching.

The template manufacturing method according to this embodiment uses the pattern forming method described in First Embodiment or Second Embodiment, in forming the mask pattern 30. Thus, as in the first embodiment and the second embodiment, it is possible to form mask patterns having various widths by using the sidewall transferring process. This eliminates the need to perform, e.g., pattern forming or processing, with the use of resist, after the sidewall transferring process is performed. As a result, it is possible to omit many processes and thereby reduce cost. The reduction in process improves yield.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A pattern forming method comprising:
    forming, on a substrate, a first resist film having a first region and a second region, and a second resist film having a third region and a fourth region, the second resist film being different from the first resist film, wherein the second resist film is laterally adjacent the first resist film, the first region is alternately arranged with the second region, and the third region is alternately arranged with the fourth region;
    irradiating the first region and the third region with light or an energy ray;
    dissolving the first resist film of the first region using a first liquid;
    forming a coating film on a side surface of the first resist film and a side surface of the second resist film after the first resist film of the first region is dissolved; and
    dissolving the second region and the third region using a second liquid that is different from the first liquid.

2. The pattern forming method according to claim 1, wherein the first liquid is alkaline.

3. The pattern forming method according to claim 1, wherein the second liquid contains an organic solvent.

4. The pattern forming method according to claim 1, wherein the first resist film includes chemically amplified positive resist.

5. The pattern forming method according to claim 1, wherein the second resist film includes non-chemically amplified main chain decomposed positive resist.

\* \* \* \* \*